US011099241B2

(12) United States Patent
Iwata

(10) Patent No.: US 11,099,241 B2
(45) Date of Patent: Aug. 24, 2021

(54) POWER TOOL

(71) Applicant: Hitachi Koki Co., Ltd., Tokyo (JP)

(72) Inventor: Kazutaka Iwata, Hitachinaka (JP)

(73) Assignee: Koki Holdings Co., Ltd., Tokyo (JP)

(*) Notice: Subject to any disclaimer, the term of this patent is extended or adjusted under 35 U.S.C. 154(b) by 991 days.

(21) Appl. No.: 14/759,571

(22) PCT Filed: Jan. 8, 2014

(86) PCT No.: PCT/JP2014/000026
§ 371 (c)(1),
(2) Date: Jul. 7, 2015

(87) PCT Pub. No.: WO2014/112325
PCT Pub. Date: Jul. 24, 2014

(65) Prior Publication Data
US 2015/0355280 A1 Dec. 10, 2015

(30) Foreign Application Priority Data
Jan. 17, 2013 (JP) .............................. JP2013-006791

(51) Int. Cl.
*G01R 31/00* (2006.01)
*G01R 31/3835* (2019.01)
(Continued)

(52) U.S. Cl.
CPC ............ *G01R 31/3835* (2019.01); *B25F 5/00* (2013.01); *G01R 31/3646* (2019.01);
(Continued)

(58) Field of Classification Search
CPC ........ B23D 47/12; B25B 23/147; H01M 2/34; H01M 10/44; H01M 10/448
(Continued)

(56) References Cited

U.S. PATENT DOCUMENTS 5,984,020 A * 11/1999 Meyer .................... B23D 45/16
173/171
7,541,773 B2 6/2009 Funabashi et al.
(Continued)

FOREIGN PATENT DOCUMENTS

CN 1665098 A 9/2005
CN 1864300 A 11/2006
(Continued)

OTHER PUBLICATIONS

China Intellectual Property Office office action for patent application CN201480004138.7 (dated Dec. 31, 2015).
(Continued)

*Primary Examiner* — Andrew M Tecco
*Assistant Examiner* — Eyamindae C Jallow
(74) *Attorney, Agent, or Firm* — Kilpatrick Townsend & Stockton LLP

(57) ABSTRACT

A power tool includes: a rechargeable battery; a motor; a drive circuit; an operation unit; a battery state detection circuit; a control circuit; and an interruption circuit. The battery state detection circuit detects a battery voltage, and when the detected battery voltage is lower than or equal to a prescribed voltage, the battery state detection circuit outputs a low-voltage signal. The control means outputs a control signal to the drive circuit instructing to drive the motor when the operation unit is operated and halts the output of the control signal to the drive circuit instructing to halt driving the motor in response to the low-voltage signal. The interruption circuit outputs an interruption signal to the drive circuit in response to the low-voltage signal to thereby interrupt the drive circuit and halt driving the motor irrespective of whether or not the control signal is outputted to the drive circuit.

11 Claims, 4 Drawing Sheets

(51) Int. Cl.
*G01R 31/36* (2020.01)
*B25F 5/00* (2006.01)
*H01M 10/48* (2006.01)
*H01M 10/42* (2006.01)
*H01M 10/44* (2006.01)

(52) U.S. Cl.
CPC ....... *H01M 10/425* (2013.01); *H01M 10/448* (2013.01); *H01M 10/48* (2013.01); *H01M 2010/4278* (2013.01); *H01M 2220/30* (2013.01)

(58) Field of Classification Search
USPC ........................................................ 173/2, 4
See application file for complete search history.

(56) References Cited

U.S. PATENT DOCUMENTS

| | | | |
|---|---|---|---|
| 7,681,659 B2 * | 3/2010 | Zhang | B25B 21/00 173/1 |
| 7,719,234 B2 | 5/2010 | Carrier et al. | |
| 7,728,553 B2 * | 6/2010 | Carrier | H02J 7/0021 320/119 |
| 7,882,900 B2 * | 2/2011 | Borinato | B23B 45/008 173/176 |
| 7,932,697 B2 | 4/2011 | Funabashi et al. | |
| 7,932,701 B2 | 4/2011 | Funabashi et al. | |
| 2005/0073282 A1 | 4/2005 | Carrier et al. | |
| 2007/0090807 A1 | 4/2007 | Ziegler et al. | |
| 2007/0210733 A1 * | 9/2007 | Du | H02K 1/278 318/268 |
| 2008/0061742 A1 | 3/2008 | Funabashi et al. | |
| 2011/0000689 A1 * | 1/2011 | Funabashi | H01M 10/441 173/2 |
| 2011/0037435 A1 | 2/2011 | Funabashi et al. | |
| 2011/0242717 A1 | 10/2011 | Funabashi et al. | |
| 2012/0274245 A1 | 11/2012 | Takano et al. | |
| 2013/0062955 A1 | 3/2013 | Suzuki | |
| 2014/0166323 A1 * | 6/2014 | Cooper | F16P 3/148 173/1 |
| 2015/0171654 A1 * | 6/2015 | Horie | H02J 7/0063 173/2 |

FOREIGN PATENT DOCUMENTS

| | | | | |
|---|---|---|---|---|
| CN | 102712087 A | 10/2012 | | |
| EP | 1903657 A2 | 3/2008 | | |
| JP | 2005-6384 A | 1/2005 | | |
| JP | 2008-62343 A | 3/2008 | | |
| JP | WO 2011024479 A2 * | 3/2011 | ........... | G05B 19/048 |
| WO | WO2011024479 A2 | 3/2011 | | |
| WO | WO2011090220 A2 | 7/2011 | | |
| WO | WO2012008244 A1 | 1/2012 | | |

OTHER PUBLICATIONS

International Search Report for application PCT/JP2013/000026 (dated Jun. 10, 2014).
International Report on Patentability for application PCT/JP2014/000026 (dated Jul. 30, 2015), 7 pages.

* cited by examiner

[Fig. 1]
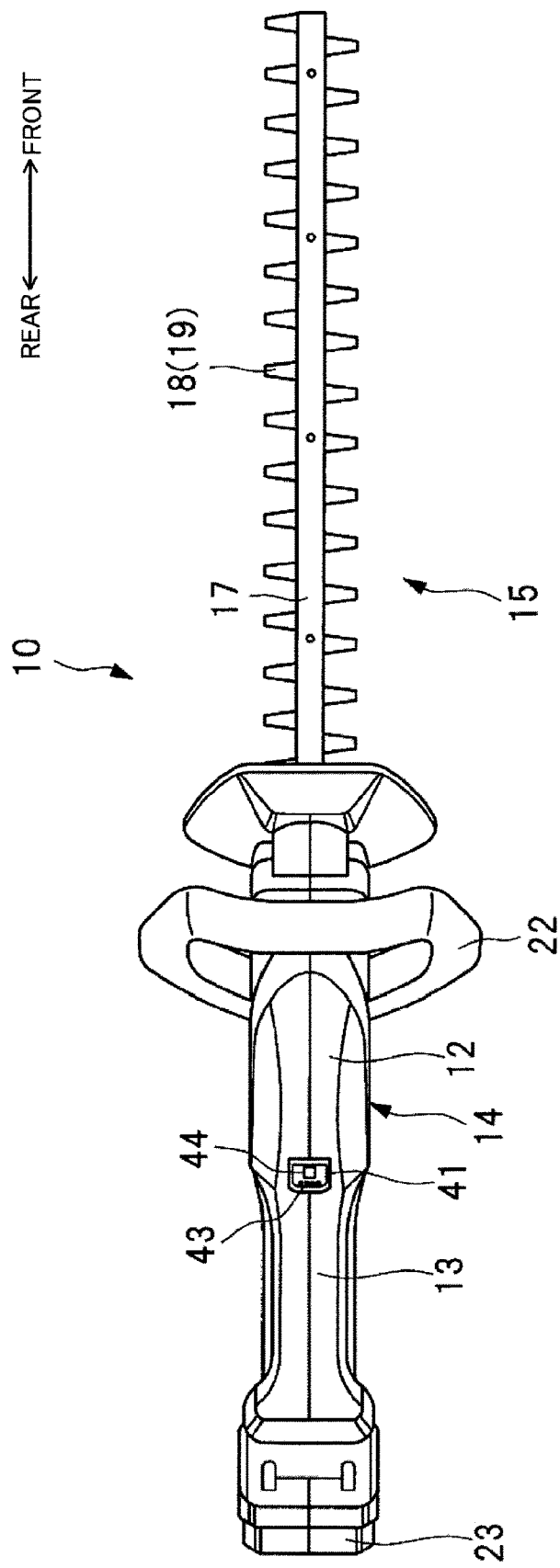

[Fig. 2]
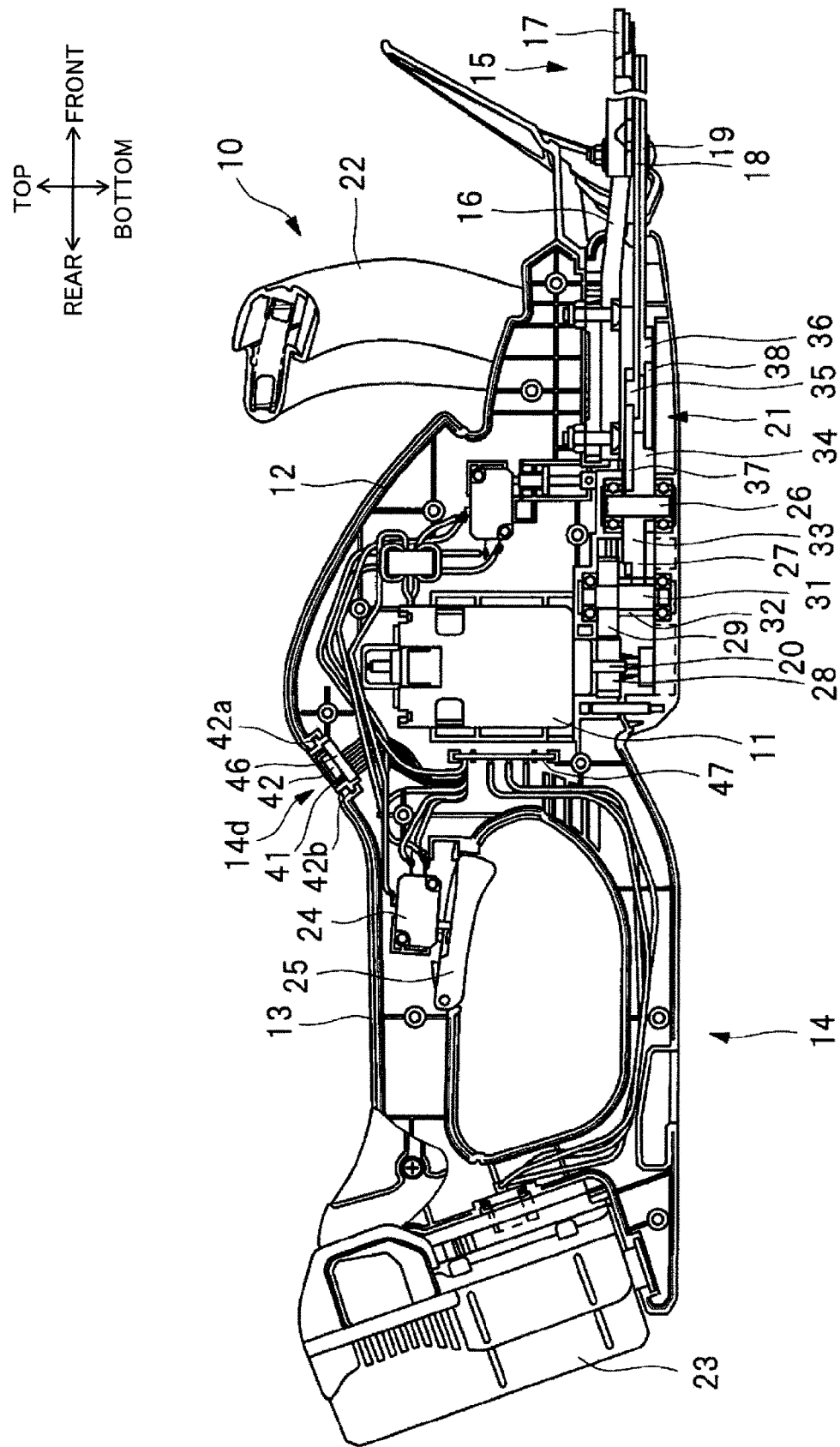

[Fig. 3]
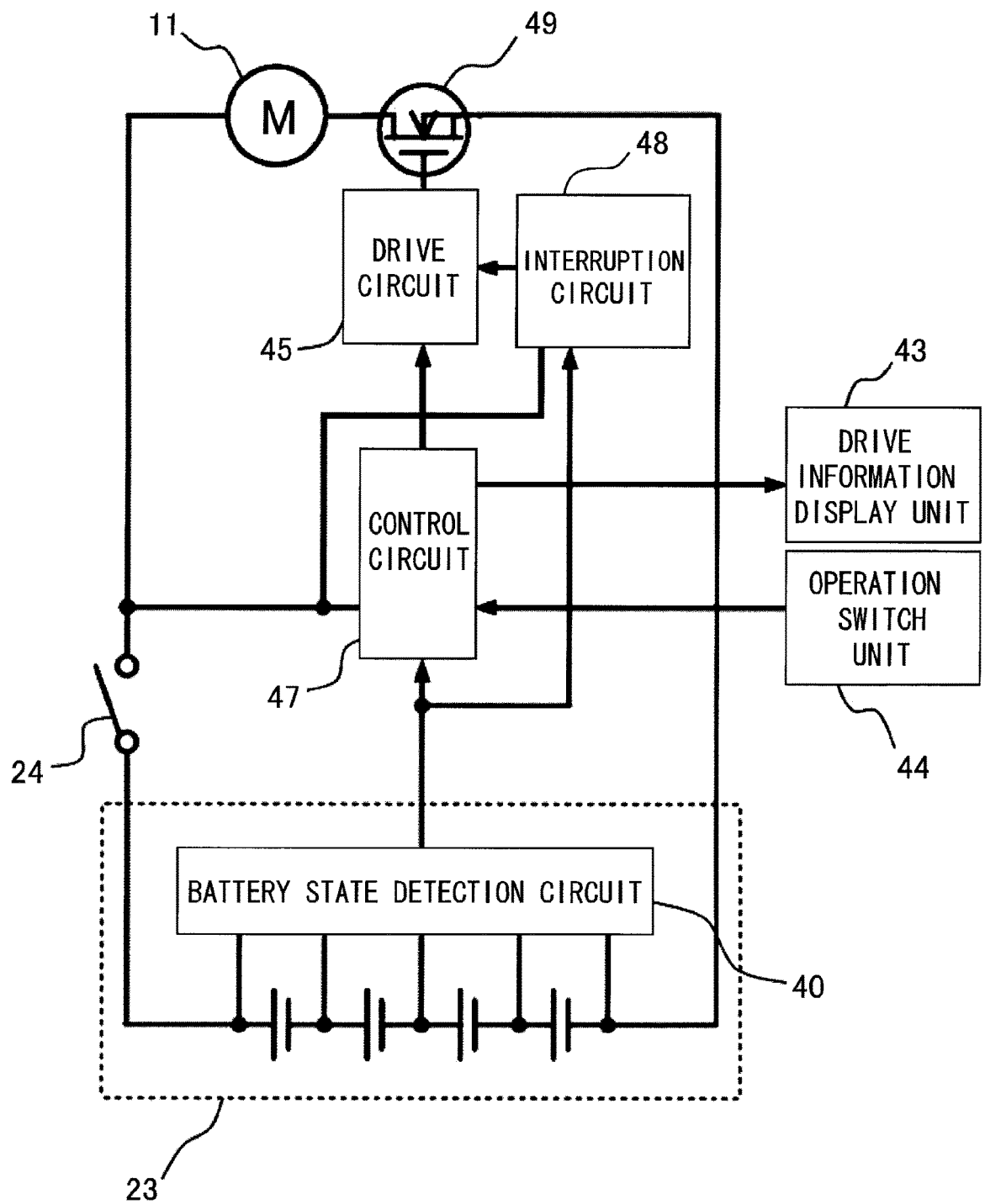

[Fig. 4]
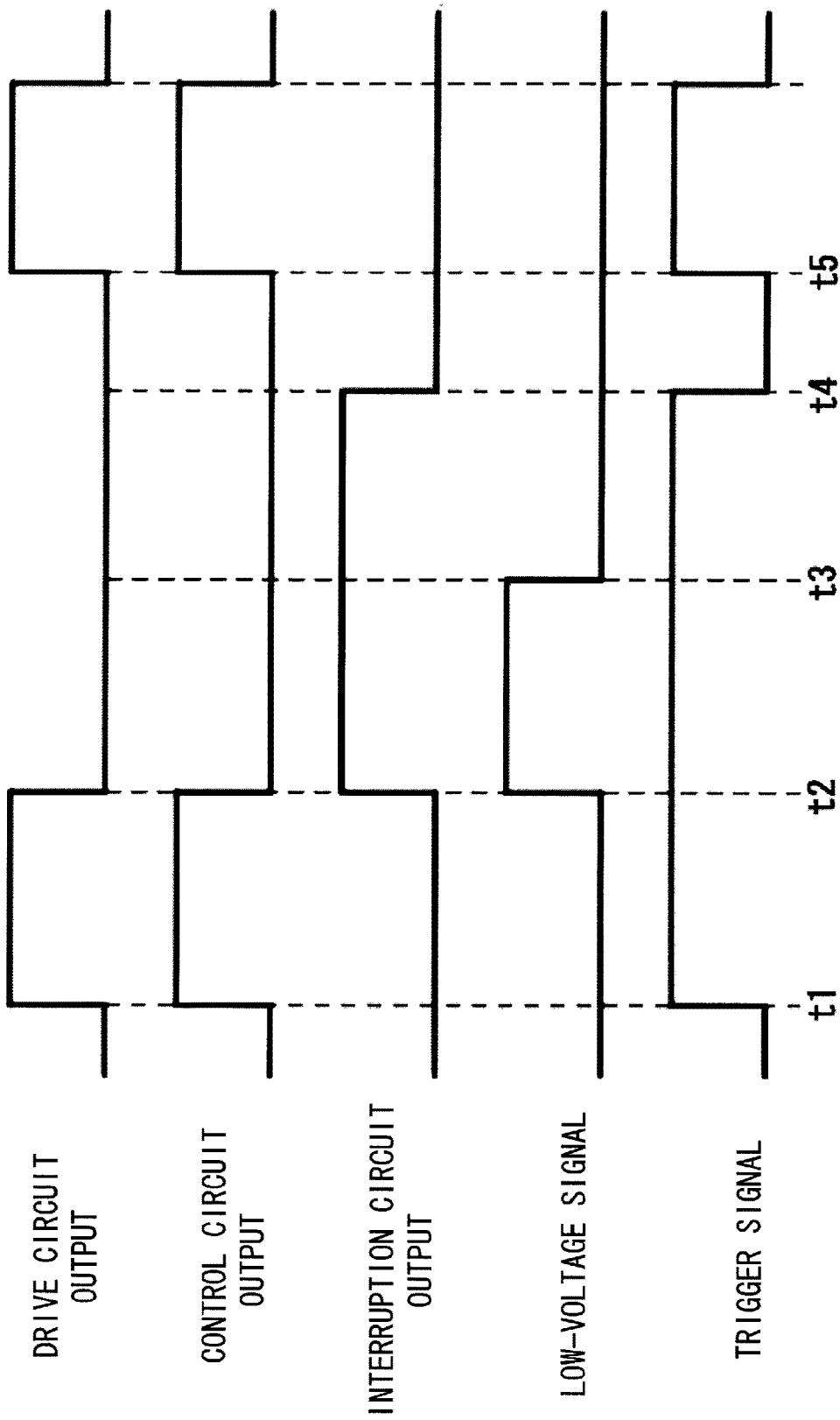

POWER TOOL

TECHNICAL FIELD

The present invention relates to a power tool that uses a rechargeable battery as a power source, and particularly to a power tool that includes a control circuit for protecting a rechargeable battery from being over-discharged.

BACKGROUND ART

The following tools are known as portable power tools that are designed to drive a tip tool by using an electric motor as a power source: trimming machine, circular saw, screwdriver, impact driver, hammer, hammer drill, jigsaw, grinder, and blower. The trimming machine includes a pair of blades as a tip tool, and is used to prune trees such as branches and leaves of shrubbery or a hedge. The trimming machine is also referred to as a hedge trimmer. The circular saw includes a disc-shaped saw as a tip tool, and is used to cut or groove the works. The screwdriver includes a screwdriver bit as a tip tool, and is used to rotate screw members such as those of bolts and nuts. A screwdriver of a type that is designed to give an impact force to a tip tool is called as an impact driver, an impact wrench, or a hammer drill. The jigsaw includes reciprocating saw blades as a tip tool, and is used to carry out processing, such as curve cutting or straight cutting, for a to-be-processed object. The grinder includes a grindstone as a tip tool, and is used for polishing or grinding the works. The blower discharges the air through a nozzle, and is used to collect fallen leaves.

The problem with a rechargeable battery is that, if the rechargeable battery continues to be used even when the voltage of the rechargeable battery falls below a prescribed voltage, the rechargeable battery would begin to malfunction, or the life of the rechargeable battery might be shortened. Therefore, in the case of a portable power tool with a battery pack that supplies power to an electric motor which functions as a driving source, a protective operation that stops the supply of power from the battery pack to the electric motor for protecting the battery pack from being over-discharged needs to be carried out, if the battery pack is about to become an over-discharge state as internal voltage of the battery pack falls.

Patent Literature 1 discloses a power tool in which: when a low-voltage state is detected inside a battery pack, the battery pack outputs a low-voltage signal to the power tool; a control circuit inside the power tool receives the low-voltage signal, and then stops driving switching means that controls supply of power to a motor, thereby interrupting the supply of power to the motor to perform a protective operation for protecting the battery pack from being over-discharged. In the Patent Literature 1, the switching means is configured of MOSFET.

A power tool is also known whose rotational speed of a motor can be arbitrarily changed through settings by an operator. In the case of such a power tool, because the rotational speed of the motor can be changed, work can be conducted by setting a proper rotational speed depending on the type of the work, leading to an improvement in work efficiency. The rotational speed of the motor is controlled by connecting switching means, which is configured of semiconductor components such as MOSFETs and transistors, and a motor in series, and by PWM-driving the switching means through a PWM control unit. In this case, the PWM control unit is configured of a microcomputer having a memory.

Patent Literature 2 discloses a power tool that includes control means for controlling a rotational speed of a motor. In such a power tool, switching means for interrupting supply of power to the motor during a protective operation for protecting a rechargeable battery from being over-discharged can be used as switching means for controlling the rotational speed of the motor. Thus, there is no need to provide switching means for each of the functions. That is, when the rotational speed of the motor is controlled, the switching means is PWM-controlled to control the rotational speed of the motor. When the supply of power to the motor is interrupted, the switching means is turned OFF for the protective operation from being over-discharged.

CITATION LIST

Patent Literature

PTL 1: Japanese Patent Application Publication No. 2008-62343

PTL 2: Japanese Patent Application Publication No. 2005-6384

SUMMARY OF INVENTION

Solution to Problem

The above-stated power tool is so configured as to stop a control signal to the switching means when the PWM control unit detects the low-voltage signal. However, for example, if a wire between the PWM control unit and the rechargeable battery has been broken, the operation of stopping the motor cannot be performed even as the rechargeable battery outputs the low-voltage signal, and a protective operation for protecting the rechargeable battery from being over-discharged is not carried out.

In view of the foregoing, it is an object of the present invention to provide a power tool capable of reliably carrying out a protective operation for protecting a rechargeable battery from being over-discharged, even when a control circuit is malfunctioning.

The present invention features a power tool. The power tool includes: a rechargeable battery; a motor; drive means; an operation unit; and battery status detection means. The drive means is for driving the motor. The operation unit is operated by an operator. The battery status detection means is for detecting a battery status. The battery status detection means is configured to output an alert signal when the detected battery status indicates that further discharge from the rechargeable battery should be prohibited. In the power tool, both a hardware solution and a software solution are employed in duplicate to assure prohibition of further discharge from the rechargeable battery in response to the alert signal.

With this construction, the possibility that malfunction simultaneously occurs in both hardware and software protective mechanisms is decreased. Accordingly, the reliability of protection of the rechargeable battery is improved.

Preferably, the software solution is implemented by control means. The control means is for controlling the driving means. The control means is configured to output a control signal to the driving means instructing to drive the motor when the operation unit is operated and to halt the output of the control signal to the drive means instructing to halt driving the motor in response to the alert signal. The hardware solution is implemented by disabling means. The disabling means is for disabling the drive means in response to the alert signal. The disabling means is configured to output a disabling signal to the drive means in response to the alert signal to thereby disable the drive means and halt driving the motor irrespective of whether or not the control signal is outputted to the drive means.

With this construction, even when the control means is malfunctioning, the disabling means works independently from the control circuit and carries out a protective operation for protecting the rechargeable battery from being over-discharged. Therefore, the reliability of the protective operation is improved.

Preferably, the disabling means continuously outputs the disabling signal until the operation of the operating unit is canceled. Once the control means halts the output of the control signal, the output of the control signal is continuously halted until the operating unit is operated again after the operation is canceled.

With this construction, even when the alert signal is stopped before the operation of the operation unit is canceled, the driving means remains in a halted state. Therefore, the motor is prevented from inadvertently resuming rotating again.

Preferably, the control means includes a microcomputer.

Preferably, the disabling means includes an electronic circuit configured of discrete semiconductor components.

The present invention further features a power tool. The power tool includes a rechargeable battery; a motor; drive means; an operation unit; battery status detection means; control means, and disabling means. The drive means is for driving the motor. The battery status detection means is for detecting a battery status. When the detected battery status indicates that further discharge from the rechargeable battery should be prohibited, the battery status detection means is configured to output an alert signal. The control means is for controlling the drive means. The control means is configured to output a control signal to the drive means instructing to drive the motor when the operation unit is operated and to halt the output of the control signal to the drive means instructing to halt driving the motor in response to the alert signal. The disabling means is for disabling the drive means in response to the alert signal. The disabling means is configured to output a disabling signal to the drive means in response to the alert signal to thereby disable the drive means and halt driving the motor irrespective of whether or not the control signal is outputted to the drive means.

With this construction, even when the control means is malfunctioning, the disabling means works independently from the control circuit and carries out a protective operation for protecting the rechargeable battery from being over-discharged. Therefore, the reliability of the protective operation is improved.

Preferably, the disabling means continuously outputs the disabling signal until the operation of the operating unit is canceled. Once the control means halts the output of the control signal, the output of the control signal is continuously halted until the operating unit is operated again after the operation is canceled.

With this construction, even when the alert signal is stopped before the operation of the operation unit is canceled, the driving means remains in a halted state. Therefore, the motor is prevented from inadvertently resuming rotating again.

Preferably, the control means includes a microcomputer.

Preferably, the disabling means includes an electronic circuit configured of discrete semiconductor components.

The present invention furthermore features a power tool. The power tool includes a rechargeable battery; a motor; drive means; an operation unit; battery voltage detection means; control means; and disabling means. The drive means is for driving the motor. The operation unit is operated by an operator. The battery voltage detection means is for detecting a battery voltage across the rechargeable battery. When the detected battery voltage is lower than or equal to a prescribed voltage, the battery voltage detection means is configured to output a low-voltage signal. The control means is for controlling the drive means. The control means is configured to output a control signal to the drive means instructing to drive the motor when the operation unit is operated and to halt the output of the control signal to the drive means instructing to halt driving the motor in response to the low-voltage signal. The disabling means is for disabling the drive means in response to the low-voltage signal. The disabling means is configured to output a disabling signal to the drive means in response to the low-voltage signal to thereby disable the drive means and halt driving the motor irrespective of whether or not the control signal is outputted to the drive means.

With this construction, even when the control means is malfunctioning, the disabling means works independently from the control circuit and carries out a protective operation for protecting the rechargeable battery from being over-discharged. Therefore, the reliability of the protective operation is improved.

Preferably, the disabling means continuously outputs the disabling signal until the operation of the operating unit is canceled. Once the control means halts the output of the control signal, the output of the control signal is continuously halted until the operating unit is operated again after the operation is canceled.

With this construction, even when the alert signal is stopped before the operation of the operation unit is canceled, the driving means remains in a halted state. Therefore, the motor is prevented from inadvertently resuming rotating again.

Preferably, the control means includes a microcomputer having a memory for storing at least the prescribed voltage.

Preferably, the disabling means includes an electronic circuit configured of discrete semiconductor components.

Advantageous Effects of Invention

According to the power tool of the present invention, even when control means is malfunctioning or when a signal of battery state detection means is not properly input to the control means, disabling means, which works independently from the control means, carries out a protective operation for protecting a rechargeable battery from being over-discharged. Therefore, the reliability of the protective operation can be improved.

BRIEF DESCRIPTION OF DRAWINGS

FIG. 1 is a plan view showing a trimming machine as one example of a portable power tool according to a preferred embodiment of the present invention.

FIG. 2 is an enlarged vertical cross-sectional view of a casing of the trimming machine shown in FIG. 1.

FIG. 3 is a block diagram showing a control system of the trimming machine shown in FIGS. 1 and 2.

FIG. 4 is a diagram showing waveform of signals outputted from the control system of the trimming machine during a protective operation for protecting batteries from being over-discharged.

DESCRIPTION OF EMBODIMENTS

Next, a preferred embodiment of the present invention will be described while referring to the accompanying drawings. FIGS. 1 and 2 show a trimming machine, which is one example of a portable power tool, i.e. a hedge trimmer. A trimming machine 10 includes a casing 14 as a portable power tool body. The casing 14 integrally includes a power source housing unit 12 and a main handle 13. The power source housing unit 12 houses an electric motor 11 as a power source. The main handle 13 is disposed on a rear side of the power source housing unit 12. A blade assembly 15 that is a blade assembled body is provided in a front end portion of the casing 14 as a tip tool. The blade assembly 15 protrudes forwards from the front end portion of the casing 14.

The blade assembly 15 includes a guide bar 17 that is fixed to the casing 14 through a bracket 16. Two trimming blades, i.e. blades 18 and 19, are mounted on the guide bar 17 so as to freely move backwards and forwards in a longitudinal direction of the guide bar 17, i.e. a front-rear direction. In the blade assembly 15, the blade 18 is a trimming blade placed on an upper side, and the blade 19 is a trimming blade placed on a lower side. The blades 18 and 19 each are a rod-shaped plate, and both longitudinal-direction sides of the plate are formed into a comb shape with a plurality of comb tooth portions. The blade 18 has a cutting blade provided on a front side of each comb tooth portion. The blade 19 has a cutting blade provided on a rear side of each comb tooth portion.

The electric motor 11 includes an output shaft 20. The output shaft 20 rotates as the electric motor 11 is driven. A power conversion mechanism 21 is provided in the power source housing unit 12. The power conversion mechanism 21 decelerates the rotation of the output shaft 20, and converts the decelerated rotation into linear reciprocating motion of the blades 18 and 19. That is, the blades 18 and 19 are driven by the electric motor 11 in such a way as to move backwards and forwards in the front-rear direction. The reciprocating motion of the blades 18 and 19 will be described later in detail.

A sub-handle is provided in the front end portion of the casing 14. When pruning trees such as branches and leaves of shrubbery or a hedge, an operator operates the trimming machine 10 by holding the main handle 13 in one hand and the sub-handle 22 in the other hand.

A battery pack 23 is detachably mounted in a rear end portion of the casing 14. A plurality of batteries for supplying power to the electric motor 11 is incorporated into the battery pack 23.

A trigger 25 is provided in the main handle 13 as an operation lever. A trigger switch 24 is incorporated into the trigger 25, and is turned ON and OFF by the trigger 25. When an operator turns the trigger 25 ON, power is supplied to the electric motor 11, and the electric motor 11 is driven to rotate.

The power conversion mechanism 21 includes a cam gear 27. The cam gear 27 is mounted on a support shaft 26 that is rotatably supported by the casing 14. The power conversion mechanism 21 includes two-stage reducing gear pairs for decelerating the rotation of the output shaft 20 of the electric motor and for conveying the decelerated rotation to the cam gear 27. One reducing gear pair includes a pinion 28 and a reducing gear 29. The pinion 28 is fixed to the output shaft 20. The reducing gear 29 is larger in diameter than the pinion 28. The reducing gear 29 is mounted on a support shaft 31 that is rotatably supported by the casing 14, and engages with the pinion 28. The other reducing gear pair includes a pinion 32 and a cam gear 27. The pinion 32 is mounted on the support shaft 31 that is rotatably supported by the casing 14, and rotates together with the reducing gear 29. The cam gear 27 is larger in diameter than the pinion 32. The cam gear 27 is mounted on a support shaft 26 that is rotatably supported by the casing 14, and engages with the pinion 32. The rotation of the output shaft 20 is decelerated by the two-stage reducing gear pairs before being conveyed to the cam gear 27.

Circular eccentric cams 33 and 34 are eccentrically provided with respect to a rotation center of the support shaft 26 on both internal and lateral sides of the cam gear 27. The difference in phase between the internal-side eccentric cam 33 and the lateral-side eccentric cam 34 is almost 180 degrees in a rotation direction of the cam gear 27. A connection pin 35 is provided in a base end portion of the blade 18 so as to protrude inside the casing 14. A connection pin 36 is provided in a base end portion of the blade 19 so as to protrude outside the casing 14. One end portion of a cam rod 37 is swingably connected to the connection pin 35. A fitting hole is formed in the other end portion of the cam rod 37. The eccentric cam 33 is rotatably fitted into the fitting hole. One end portion of a cam rod 38 is swingably connected to the connection pin 36. A fitting hole is formed in the other end portion of the cam rod 38. The eccentric cam 34 is rotatably fitted into the fitting hole.

Accordingly, as the output shaft 20 is driven to rotate, the rotation of the cam gear 27 is converted into the linear reciprocating motion of the blades 18 and 19 through the cam rods 37 and 38. The difference in phase between the centers of the eccentric cams 33 and 34 with respect to the center of the support shaft 26 is about 180 degrees in a circumferential direction. Therefore, as the cam gear 27 is driven to rotate, one of the blades 18 and 19 that are paired is driven so as to move forwards, and the other is driven so as to move backwards. In this manner, the blades 18 and 19 are driven linearly in opposite directions, and trees are pruned by the cutting blade provided on the front side of the each comb tooth portions of the blade 18 and the cutting blade provided on the rear side of the each comb tooth portions of the blade 19.

The casing 14 includes a holder 42 that is attached to the power source housing section 12. An operation display panel 41 is arranged in a tip portion of the main handle 13 disposed on an upper surface of the casing 14 as shown in FIG. 1. The operation display panel 41 is provided on a front surface of the holder 42 as shown in FIG. 2. The holder 42 has a convex portion 42a on a front end and a convex portion 42b on a rear end. The holder 42 is mounted on the casing 14 as the convex portions 42a and 42b are respectively engaged into concave portions formed on the casing 14.

The operation display panel 41 includes a drive information display unit 43 and an operation switch unit 44 as shown in FIG. 1. The drive information display unit 43 displays drive information of the trimming machine. When the operation switch unit 44 is operated, the rotational speed of the electric motor 11 is set and a specific piece of drive information is selected among a plurality of pieces of drive information displayed on the drive information display unit 43. The rotational speed of the electric motor 11 corresponding to the operating speed of the blades 18 and 19 is displayed on the drive information display unit 43 as the drive information.

The drive information display unit 43 includes a plurality of light-emitting units configured of LEDs. If the operating speed of the blades 18 and 19, i.e. the rotational speed of the electric motor 11, is displayed through the light-emitting units, the number of light-emitting units that are turned ON is changed to indicate various rotational speeds. For example, for the highest rotational speed, all the light-emitting units are turned ON; and for the lowest rotational speed, only one light-emitting unit is turned ON. As the rotational speed goes up, the number of light-emitting units that are turned ON is increased. In this manner, the drive information display unit 43 indicates various rotational speeds.

A circuit board 46 is provided on a back side of the holder 42 as shown in FIG. 2. The circuit board 46 is connected to a control circuit 47 through a cable. The control circuit 47 includes a microprocessor and a memory (not shown). Output signals from the trigger switch 24 and the operation switch unit 44 are transmitted to the microprocessor. The microprocessor outputs control signals to the electric motor 11 and the drive information display unit 43 based on the output signals.

FIG. 3 is a block diagram showing a control system of the trimming machine 10. The control system of the trimming machine 10 is configured of the electric motor 11, the battery pack 23, the trigger switch 24, the operation switch unit 44, the drive information display unit 43, a switching means 49, a drive circuit 45, the control circuit 47 and an interruption circuit 48.

The electric motor 11 is a DC motor with brush, and is driven as power is supplied from the battery pack 23. The switching means 49 is provided between the electric motor 11 and a GND electrode of the battery pack 23 so as to control the supply of power to the electric motor 11. The switching means 49 is configured of a semiconductor element, such as a MOSFET, IGBT, transistor, and the like. A drive circuit 45 is connected to the switching means 49, and drives the switching means 49 based on signals inputted from the control circuit 47 and the interruption circuit 48. As the switching means 49 is driven, power is supplied from the battery pack 23 to the electric motor 11. In this manner, the drive circuit 45 controls the supply of power to the electric motor 11 by driving the switching means 49. Further, the trigger switch 24 is connected between the electric motor 11 and a positive electrode of the battery pack 23.

The battery pack 23 includes a battery state detection circuit 40 for detecting the state of each battery. When the battery state detection circuit 40 detects a low-voltage state of the battery, the battery state detection circuit 40 outputs a low-voltage signal indicating that the battery pack 23 is about to become an over-discharge state to the control circuit 47 and the interruption circuit 48.

The trigger switch 24 outputs a trigger signal when turned ON by the trigger 25, and stops outputting the trigger signal when turned OFF by the trigger 25. The operation switch unit 43 outputs an output signal when operated by an operator. The drive information display unit 43 displays the drive information based on a control signal from the control circuit 47.

The control circuit 47 is connected between the battery state detection circuit 40 and the drive circuit 45, and includes the microprocessor (not shown) as described above. The microprocessor outputs control signals including a PWM signal to the drive circuit 45 and the drive information display unit 43 based on the trigger signal from the trigger switch 24, the output signal from the operation switch unit 44, and the low-voltage signal from the battery state detection circuit 40.

The interruption circuit 48 is an electronic circuit that is configured of discrete semiconductor components. The interruption circuit 48 is connected between the battery state detection circuit 40 and the drive circuit 45. The interruption circuit 48 outputs an interruption signal to the drive circuit 45 based on the trigger signal from the trigger switch 24 and the low-voltage signal from the battery state detection circuit 40.

FIG. 4 is a diagram showing the waveform of signals output from the control system of the trimming machine 10 during a protective operation for protecting the batteries from being over-discharged. When an operator operates the trigger 25 and the trigger switch 24 is turned ON, the trigger switch 24 outputs a trigger signal. The control circuit 47 detects the operation of the trigger 25 based on the trigger signal, and outputs a control signal to the drive circuit 45. The drive circuit 45 drives the switching means based on the control signal from the control circuit 47. As a result, the electric motor 11 starts rotating (t1). When an operating speed is set through operation of the operation switch unit 44, the control circuit 47 outputs a PWM signal based on a setting value of the operating speed to the drive circuit 45, and controls the rotational speed of the electric motor 11.

As the electric motor 11 is driven repeatedly, the capacity of the battery pack 23 decreases. When the battery voltage of the battery pack 23 becomes lower than or equal to a prescribed voltage, the battery state detection circuit 40 outputs a low-voltage signal to carry out a protective operation for protecting the battery pack 23 from being over-discharged (t2). The low-voltage signal from the battery state detection circuit 40 is inputted to the control circuit 47 and the interruption circuit 48. When the control circuit 47 detects the low-voltage signal, the control circuit 47 starts a protective operation to halt outputting the control signals. When the input of the control signal is halted, the drive circuit 45 halts driving the switching means 49. As a result, the supply of power from the battery pack 23 to the electric motor 11 is halted. When the low-voltage signal is inputted to the interruption circuit 48, the interruption circuit 48 also starts a protective operation to output the interruption signal to the drive circuit 45. The drive circuit also halts driving the switching means 49 when the interruption signal is input from the interruption circuit 48.

After the protective operation is started based on the low-voltage signal, the output of the interruption signal form the interruption circuit 48 continues as long as the operation of the trigger 25, which has started during the output of the low-voltage signal, continues, even after the output of the low-voltage signal is stopped. The switching means 49 remains in a halted state, thereby preventing the electric motor 11 from inadvertently resuming rotating again (t3).

When the operation of the trigger 25 is canceled and the output of the trigger signal from the trigger switch 24 is stopped, the interruption circuit 48 stops outputting the interruption signal (t4). The low-voltage signal has also been stopped, therefore, the control circuit 47 becomes able to accept operation of the trigger 25 again. When the trigger 25 is operated again, the control circuit 47 outputs a control signal to the drive circuit 45 based on a trigger signal from the trigger switch 24. The drive circuit 45 drives the switching means 49 based on the control signal from the control circuit 47. As a result, the electric motor 11 resumes rotating (t5).

The low-voltage signal from the battery pack 23 is simultaneously inputted to the control circuit 37 and the interruption circuit 48. When the control circuit 47 detects the low-voltage signal, the control circuit 47 halts outputting the control signal, and starts the protective operation. When the low-voltage signal is inputted to the interruption circuit 48, the interruption circuit 48 outputs the interruption signal to the drive circuit 45, and starts the protective operation. The electric motor 11 stays in a halted state, even if the control signal is inputted to the drive circuit 45 during the output of the interruption signal from the interruption circuit 48. That is, if the control signal for driving the electric motor 11 is being outputted from the control circuit 47 during the output of the low-voltage signal from the battery state detection circuit 40, the interruption signal outputted from the interruption circuit 48 is prioritized over the control signal from the control circuit 47, and the driving by the drive circuit 45 of the switching means 49 is forcibly made impossible. Therefore, the protective operation for protecting the battery pack 23 from being over-discharged is reliably carried out.

As described above, the control circuit 47 carries out the protective operation of the battery pack 23 on software of the microprocessor, whereas the interruption circuit 48 carries out the protective operation of the battery pack 23 on hardware. Therefore, even if one of the circuits fails, the battery pack 23 can be reliably protected from being over-discharged. Moreover, the protective mechanisms are formed on both the software and hardware. Therefore, the possibility that malfunction simultaneously occurs in both protective mechanisms is decreased. Accordingly, the reliability of protection of the battery pack 23 is improved.

Incidentally, even if the interruption circuit 48 is malfunctioning for some reason and no interruption signal is outputted, the low-voltage signal is inputted to the control circuit 47. Therefore, the output of the control signal is halted, and the protective operation is carried out.

In addition, when the control signal for driving the electric motor 11 is outputted from the control circuit 47 even as the interruption circuit 48 is outputting the interruption signal, or when the interruption circuit 48 is not running even as the control circuit 47 has halted outputting the control signal in order to halt the electric motor 11 in response to the low-voltage signal outputted from the battery state detection circuit 40, then it can be determined that the circuits are malfunctioning. Accordingly, the trimming machine 10 may notify an operator of the troubles through the drive information display unit 43 or any other notification means.

While FIGS. 1 and 2 show the trimming machine 10 as a portable power tool, the portable power tool to which the operation display panel 41 shown in FIG. 1 can be applied is not limited to the trimming machine 10. As long as a power source is incorporated into a casing, and operator can hold portable power tools in their hands to do work, the operation display panel 41 shown in FIG. 1 can be mounted on the portable power tools such as circular saw, screwdriver, impact driver, hammer, hammer drill, jigsaw, grinder, blower, and the like.

REFERENCE SIGNS LIST

10 Trimming Machine
11 Electric Motor
12 Power Source Housing Unit
13 Main Handle
14 Casing
15 Blade Assembly
16 Bracket
17 Guide Bar
18, 19 Blade
20 Output Shaft
21 Power Conversion Mechanism
22 Sub-handle
23 Battery Pack
24 Trigger Switch
25 Trigger
26 Support Shaft
27 Cam Gear
28 Pinion
29 Reducing Gear
31 Support Shaft
32 Pinion
33, 34 Eccentric Cam
35, 36 Connection Pin
37, 38 Cam Rod
40 Battery State Detection Circuit
41 Operation Display Panel
42 Holder
43 Drive Information Display Unit
44 Operation Switch
45 Drive Circuit
47 Control Circuit
48 Interruption Circuit
49 Switching Means

The invention claimed is:

1. A power tool comprising:
a motor;
a switching portion provided between the motor and a power source;
a drive unit configured to output a drive signal driving the switching portion to allow power from the power source to be supplied to the motor;
a controller comprising a microprocessor and configured to control rotational speed of the motor, the controller being configured to output to the drive unit a control signal for rotating the motor at a speed being controlled, the drive unit being configured to output the drive signal to allow the motor to rotate at the speed being controlled in response to the control signal, the controller being configured to interrupt the drive unit to halt outputting the drive signal to cause driving of the switching portion to be halted; and
an interruption unit configured to interrupt the drive unit to halt outputting the drive signal to cause driving of the switching portion to be halted even when the control signal is outputted, the interruption unit and the controller being operable independently of each other,
wherein in a situation where the motor is to be unpowered, the controller and the interruption unit operate in duplicate so as to interrupt the drive unit.

2. The power tool according to claim 1, wherein the controller and the interruption unit are configured to receive a stop signal, the controller being configured to interrupt the drive unit to halt outputting the control signal in response to the stop signal, the interruption unit being configured to interrupt the drive unit in response to the stop signal.

3. The power tool according to claim 1, wherein the drive signal includes a Pulse With Modulation (PWM) signal for driving the switching portion to control the rotational speed of the motor in accordance with the control signal.

4. The power tool according to claim 1, wherein the controller and the interruption unit integrally constitute a fail-safe arrangement employed to cause driving of the switching portion to be halted.

5. A power tool comprising:
a motor;
a switching portion switchable between an ON state and an OFF state, the motor being powered when the switching portion is in the ON state and being unpowered when the switching portion is in the OFF state;
a drive unit configured to set the switching portion to the ON state when the motor is to be powered and to set the switching portion to the OFF state when the motor is to be unpowered;
a controller comprising a microprocessor and configured to control rotational speed of the motor, the controller being configured to output to the drive unit a control signal for rotating the motor at a speed being controlled, the drive unit being configured to set the switching portion to the ON state to allow the motor to rotate at the speed being controlled in response to the control signal, the controller being configured to interrupt the drive unit to set the switching portion to the OFF state; and
an interruption unit configured to interrupt the drive unit to set the switching portion to the OFF state irrespective of whether the control signal is outputted, the interruption unit and the controller being operable independently of each other,
wherein in a situation where the motor is to be unpowered, the controller and the interruption unit operate in duplicate so as to interrupt the drive unit.

6. The power tool according to claim 5, wherein the switching portion is provided between the motor and a power source.

7. The power tool according to claim 5, wherein the drive unit is configured to output a Pulse With Modulation (PWM) signal for switching the switching portion between the ON state and the OFF state to control the rotational speed of the motor in accordance with the control signal.

8. The power tool according to claim 5, wherein the controller and the interruption unit integrally constitute a fail-safe arrangement employed to set the switching portion to the OFF state.

9. A power tool comprising:
a motor;
a switching portion switchable between an ON state and an OFF state, the motor being powered when the switching portion is in the ON state and being unpowered when the switching portion is in the OFF state; and
a fail-safe arrangement including a first interrupting part and a second interrupting part, the first interrupting part being operable to set the switching portion to the OFF when the motor is to be unpowered, the first interrupting part including a controller configured to control rotational speed of the motor, the switching portion being set to the ON state to allow the motor to rotate at a speed being controlled, the second interrupting part being operable to set the switching portion to the OFF state when the motor is to be unpowered, the second interrupting part being operable independently of the first interrupting part.

10. The power tool according to claim 9, wherein the first interrupting part is a software solution employed to set the switching portion to the OFF state and the second interrupting part is a hardware solution employed to set the switching portion to the OFF state.

11. The power tool according to claim 9, wherein the fail-safe arrangement includes a drive unit configured to set the switching portion to the ON state when the motor is to be powered and to set the switching portion to the OFF state when the motor is to be unpowered, and both of the first interrupting part and the second interrupting part includes the drive unit.

* * * * *